(12) United States Patent
Lantz et al.

(10) Patent No.: US 7,440,155 B1
(45) Date of Patent: Oct. 21, 2008

(54) MASS-BALANCED ACTUATING MECHANISM FOR A MICRO SCANNING DEVICE

(75) Inventors: Mark A. Lantz, Adliswil (CH); Hugo E. Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/955,542

(22) Filed: Dec. 13, 2007

(51) Int. Cl.
G02B 26/08 (2006.01)
H02K 5/00 (2006.01)

(52) U.S. Cl. .................. 359/198; 359/391; 359/393; 310/40 MM

(58) Field of Classification Search .......... None
See application file for complete search history.

(56) References Cited

U.S. PATENT DOCUMENTS

| | | | |
|---|---|---|---|
| 5,009,473 A * | 4/1991 | Hunter et al. | 359/214 |
| 5,834,864 A | 11/1998 | Hestermann et al. | |
| 5,986,381 A | 11/1999 | Hoen et al. | |
| 6,583,524 B2 | 6/2003 | Brandt | |
| 6,639,313 B1 | 10/2003 | Martin et al. | |
| 6,953,985 B2 | 10/2005 | Lin et al. | |
| 7,132,721 B2 | 11/2006 | Platt et al. | |
| 7,372,025 B2 * | 5/2008 | Hoen et al. | 250/306 |
| 2003/0057803 A1 | 3/2003 | Hartwell | |
| 2004/0245462 A1 | 12/2004 | Binnig et al. | |
| 2007/0268099 A1 * | 11/2007 | Jeong et al. | 335/78 |

OTHER PUBLICATIONS

J. Fernando Alfaro and Gary K. Fedder, Actuation for Probe-Based Mass Data Storage, p. 1-4, Carnegie Mellon University, Pittsburgh.
Y. Lu et al., Design, Fabrication and Control of a Micro X-Y Stage with Large Ultra-thin Film Recoding Media Platform, Proceedings of the 2005 IEEE/ASME International Conference on Advanced Intelligent Mechatronics, Jul. 2005, p. 19-24, Monterey.
Mark A. Lantz et al., A Vibration Resistant Nanopositioner for Mobile Parallel-Probe Storage Applications, Journal for Microelectronical Systems, Feb. 2007, pp. 130-139. vol. 16, No. 1, IEEE.

* cited by examiner

Primary Examiner—James Phan
(74) Attorney, Agent, or Firm—Cantor Colburn LLP; Martin Toleti

(57) ABSTRACT

An actuating mechanism includes a scanner chip having a scan table mounting cavity, and a bracket moveably positioned in the scan table mounting cavity. A scan table is moveably positioned in the bracket. The bracket has a first mass and the scan table has a second mass. A first coil and frame collectively define a third mass and a second coil and frame collectively define a fourth mass. A first pivoting element is connected to the first coil and the scan table. The first pivoting element is pivotally supported about a first pivot point and connected though an asymmetrical leverage connection to the first coil and the scan table. A second pivoting element is connected to the second coil and the scan table. The second pivoting element is pivotally supported about a second pivot point and connected through a symmetric leverage connection to the second coil and the scan table.

5 Claims, 2 Drawing Sheets

MASS-BALANCED ACTUATING MECHANISM FOR A MICRO SCANNING DEVICE

BACKGROUND OF THE INVENTION

1. Field of the Invention

This invention relates to the art of probe storage systems and, more particularly, to an actuating mechanism for a micro-scanning device portion of a probe storage system.

2. Description of Background

Parallel probe-based data-storage systems are currently being developed for future data-storage applications. A parallel probe-based system employs a large array of atomic-force microscope probes that read, write and erase data on a storage medium carried by an X/Y scanning system. The large array of probes enables very high storage densities to be achieved. Moreover, by operating the array of probes in parallel, high data transfer rates are also achievable. The high storage capacity combined with rapid transfer rates enables the storage system to be built into a small package that is ideal for mobile storage applications.

Mobile storage applications present a variety of engineering challenges. First, mobile storage systems must be robust against vibration and shock. Second, mobile storage systems must be capable of operating on a restricted power budget. A mobile probe based storage system should be capable of maintaining sub-nanometer tracking performance while being subjected to mechanical shocks that create accelerations approaching 10s of g's. However, making a mechanical device more robust, i.e., capable of withstanding high accelerations, typically requires making components stiffer. By making the components stiffer, power consumption for certain components, e.g., actuators, increases and the device is less desirable for mobile applications.

SUMMARY OF THE INVENTION

The shortcomings of the prior art are overcome and additional advantages are provided through the provision of an actuating mechanism for a micro-scanning device. The actuating mechanism includes a scanner chip having a main body having first and second planar surfaces. The scanner chip also includes a scan table mounting cavity, a bracket positioned in the scan table mounting cavity, first and second coil mounting cavities and first and second pivoting element mounting cavities. A scan table is moveably positioned in the bracket. The bracket has a first mass and the scan table has a second mass. A first coil and frame is mounted in the first coil mounting cavity to collectively define a third mass and a second coil and frame is mounted in the second coil mounting cavity to collectively define a fourth mass. A first pivoting element is operationally connected to the first coil and the scan table. The first pivoting element is positioned in the first pivoting element mounting cavity and pivotally supported about a first pivot point. The first pivoting element has an asymmetrical leverage connection to the first coil and the scan table. A second pivoting element is operationally connected to the second coil and the scan table. The second pivoting element is positioned in the second pivoting element mounting cavity and pivotally supported about a second pivot point. The second pivoting element has one of a symmetric leverage connection and an asymmetric leverage connection to the second coil and the scan table. With this arrangement, upon subjecting the scanner chip to acceleration forces, torques generated about the first and second pivot points by inertial forces acting on the first, second, third and fourth masses are substantially balanced in order to isolate the scan table from vibration.

Additional features and advantages are realized through the techniques of exemplary embodiments of the present invention. Other embodiments and aspects of the invention are described in detail herein and are considered a part of the claimed invention. For a better understanding of the invention with advantages and features thereof, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION OF THE INVENTION

Figure 1:
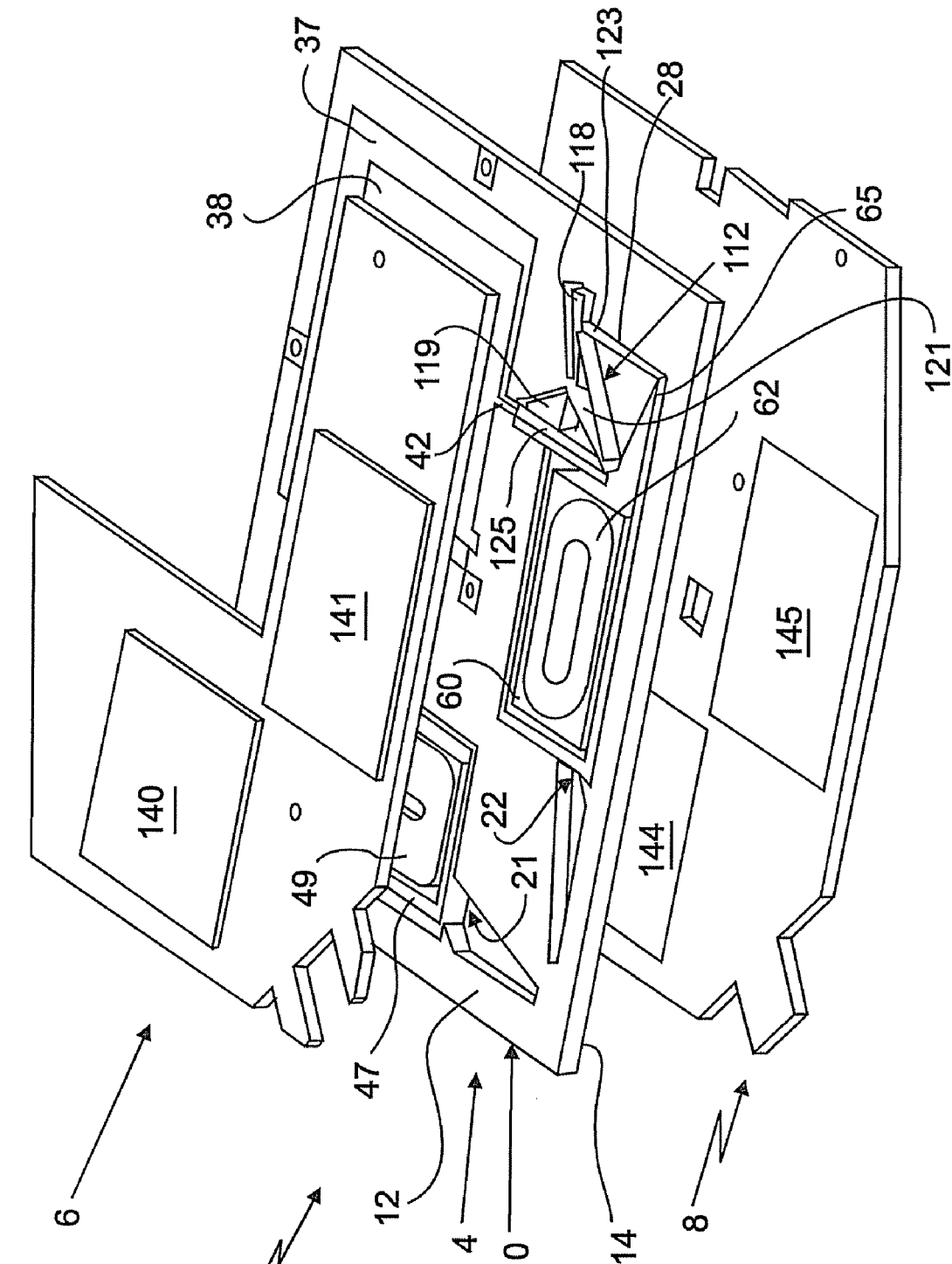
FIG. 1 is an exploded perspective view of an actuating mechanism for a micro-scanning device constructed in accordance with an exemplary embodiment of the present invention.
Figure 2:
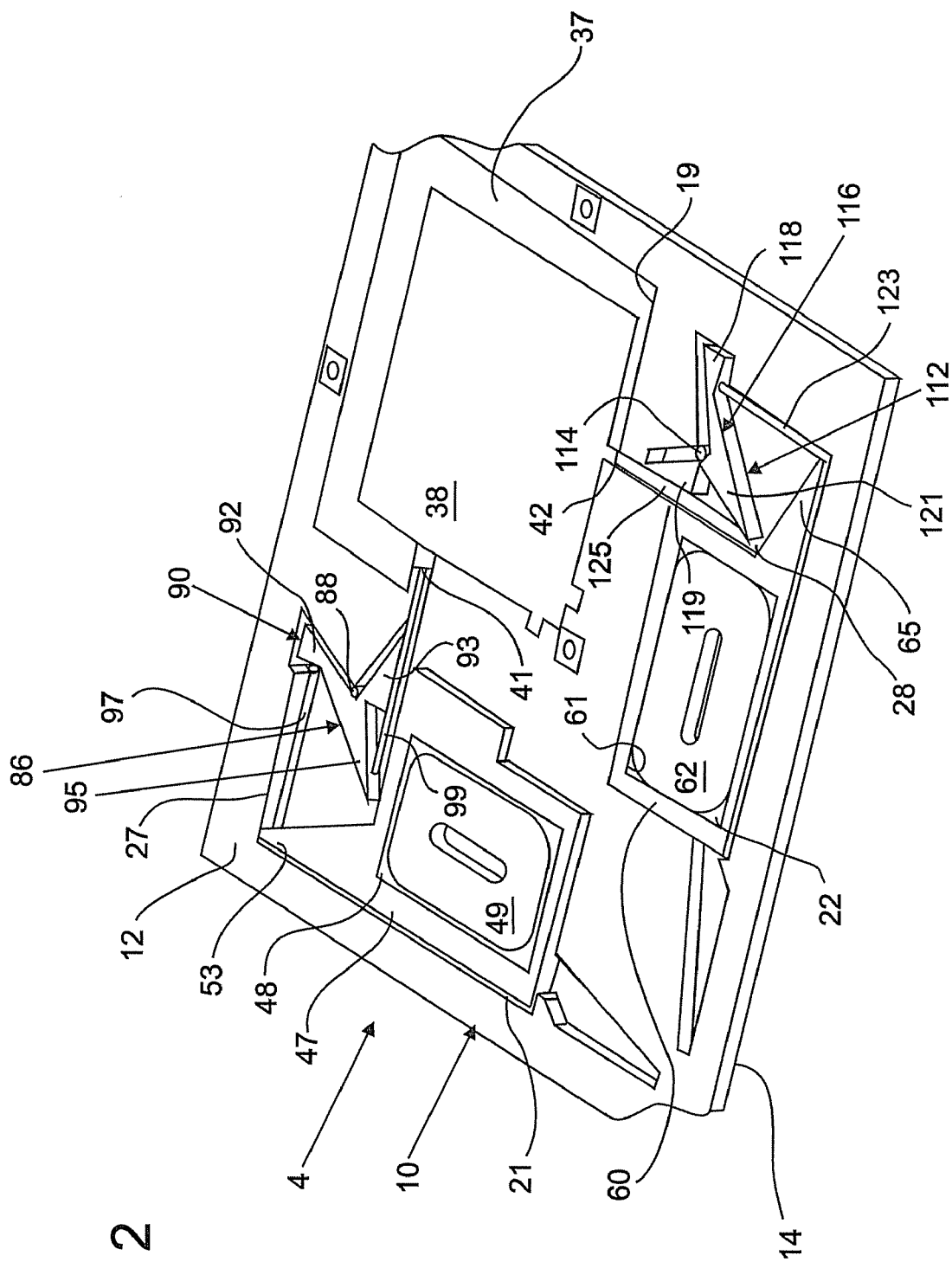
FIG. 2 is a perspective view of a scan chip portion of the actuating mechanism of FIG. 1.

With initial reference to FIGS. 1 and 2 an actuating mechanism, constructed in accordance with an exemplary embodiment of the present invention, is generally indicated at 2. Actuating mechanism 2 includes a scanner chip 4, a first plate 6 and a second plate 8. First and second plates 6 and 8 are spaced from scanner chip 4 a distance of about 20 μm. As shown, scanner chip 4 includes a main body 10 having a first planar surface 12 and an opposing, second planar surface 14 that collectively define a scan table mounting cavity 19, a first coil mounting cavity 21, a second coil mounting cavity 22, a first pivoting element mounting cavity 27, and a second pivoting element mounting cavity 28.

As best shown in FIG. 2, scanner chip 4 includes a bracket 37 and a scan table 38 shiftably mounted within scan table mounting cavity 19. In accordance with the exemplary embodiment shown, bracket 37 has a first mass "m1" and scan table 38 has a second mass "m2" and is about 6.8 mm square. In addition, scan table 38 includes a first connector member 41, and a second connector member 42 which, as will be discussed more fully below, are acted upon to selectively shift scan table 38 along first and second orthogonal axes of an X/Y plane. As also shown in FIG. 2, scanner chip 4 includes a first shuttle or frame 47 shiftably mounted within first coil mounting cavity 21. First frame 47 defines a first coil receiving opening 48 within which is positioned a first coil 49. First frame 47 and first frame 49 collectively define a third mass "m3". Frame 47 includes a connecting arm 53 that, as will become evident more fully below, is operatively connected to scan table 38. Scanner chip 4 also includes a second shuttle or frame 60 shiftably mounted within second coil mounting cavity 22. Second frame 60 defines a second coil receiving opening 61 within which is positioned a second coil 62. Second frame 60 and second coil 62 collectively define a fourth mass "m4". In a manner similar to that described above, second frame 60 includes a connecting arm 65 that is operatively connected to scan table 38. As will also become more fully evident below, first and second frames 47 and 60 are selectively shifted within first and second coil mounting cavities 21 and 22 in order to selectively position scan table 38 in a particular location within a defined X/Y plane.

As further shown in FIG. 2, first frame 47 is operatively connected to scan table 38 through a first pivoting element 86 that is selectively pivotable about a first pivot point 88. First pivoting element 86 includes a main body member 90 having a first element 92, a second element 93 and a third element 95. First pivoting element 86 also includes a first connecting beam 97 that extends from first element 92 and connects with connecting arm 53. First pivoting element 86 also includes a second connecting beam 99 that extends from third element 95 and connects with first connector member 41 provided on scan table 38.

Scanner chip 4 also includes a second pivoting element 112 that operatively interconnects second frame 60 and scan chip 38 and is pivotable about a second pivot point 114. Second pivoting element 112 includes a main body member 116 having a first element 118, a second element 119, and a third element 121. Second pivoting element 112 also includes a first connecting beam 123 that extends from first element 118 and connects to second connecting arm 56, and a second connecting beam 125 that extends from third element 121 and joins with second connecting member 42.

First and second pivoting elements 86 and 112 are selectively shifted about first and second pivot points 88 and 114 respectively through an application of a magnetic motive force. More specifically, first and second magnets 140 and 141 provided on first plate 6, and third and fourth magnets 144 and 145 provided on second plate 8 selectively act upon first and second coils 49 and 62 respectively. That is, magnets 140 and 141 are arranged in first plate 6 so as to act on a first side of first and second coils 49 and 62, while third and fourth magnets 144 and 145 are arranged in plate 8 to act on a second side of first and second coils 49 and 62. With this arrangement, application of electric currents to first and second coils 49 and 62 generates a force that selectively shift first and second frames 47 and 60 along first and second orthogonal axes within respective ones of the first and second coil mounting cavities 21 and 22. As first and second frames 47 and 60 shift, connecting beams 97 and 123 act upon corresponding ones of first and second pivoting elements 86 and 112. Pivoting elements 86 and 112 pivot about corresponding pivot points 88 and 114. As pivoting elements 86 and 112 pivot, first and second connecting beams 99 and 125 selectively position scan table 38 in a predetermined location defined on an X/Y plane. With this arrangement, scan table 38 can move up to 120 μm in orthogonal directions.

First pivoting element 86 includes a center of mass that is substantially coincident with first pivot point 88 and is arranged such that a leverage force exerted by connecting beam 97 about first pivot point 88 is asymmetric relative to a leverage force exerted by connecting beam 91 about first pivot point 88. That is, a distance "x" between first connecting beam 97 and pivot point 88 is different than a distance "y" defined between first pivot point 88 and second connecting beam 99 so as to establish an asymmetrical leverage connection. Conversely, second pivoting element 112 includes a center of mass that is substantially coincident with second pivot point 114 and is arranged such that a leverage force exerted by connecting beam 125 about second pivot point 114 is symmetric relative to a leverage force exerted by connecting beam 123 about second pivot point 114. More specifically, a first distance "w" defined between the first connecting beam 123 and second pivot point 114 is substantially identical to a second distance "z" defined between second connecting beam 125 and second pivot point 114 so as to establish a symmetrical leverage connection. Furthermore, the distances "x" and "y" are established to define a predetermined relationship between m1, m2 and m3. More specifically, distances "x" and "y" are employed such that a sum of m1 and m2 multiplied by distance "y" is substantially equal to m3 multiplied by distance "x". That is, y(m1+m2)=x(m3). In addition, m2, is substantially identical to m4. The use of symmetric and asymmetric pivots creates a mass balancing effect for first and second pivoting elements 86 and 112 that provides vibration rejection by balancing torques acting about first and second pivot points 88 and 114 respectively. That is, upon subjecting the scanner chip 4 to acceleration forces, torques generated about first and second pivot points 88 and 114 by inertial forces acting on first, second, third and fourth masses m1, m2, m3, and m4 are substantially balanced in order to isolate scan table 38 from vibration. Of course, it should be appreciated that both pivots can be asymmetric in accordance with alternative embodiments of the present invention. In any event, mass balancing enables the micro scanning device to withstand mechanical shocks that create high accelerations while maintaining nanometer-level precision for positioning scan table 38.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. An actuating mechanism for a micro-scanning device comprising:

a scanner chip having a main body including first and second planar surfaces, the scanner chip also includes a scan table mounting cavity, first and second coil mounting cavities and first and second pivoting element mounting cavities;

a bracket positioned in the scan table mounting cavity, the bracket having a first mass;

a scan table moveably positioned in the bracket, the scan table having a second mass;

a first frame mounted in the first coil mounting cavity;

a second frame mounted in the second coil mounting cavity;

a first coil mounted in the first frame to collectively define a third mass;

a second coil mounted in the second frame to collectively define a fourth mass;

a first pivoting element operationally connected to the first coil and the scan table, the first pivoting element being pivotally positioned in the first pivoting element mounting cavity and pivotally supported about a first pivot point, the first pivoting element having an asymmetrical leverage connection to the first coil and the scan table; and a second pivoting element operationally connected to the second coil and the scan table, the second pivoting element being positioned in the second pivoting element mounting cavity and pivotally supported about a second pivot point, the second pivoting element having one of a symmetric leverage connection and an asymmetric leverage connection to the second coil and the scan table, wherein upon subjecting the scanner chip to acceleration forces, torques generated about the first and second pivot points by inertial forces acting on the first, second, third and fourth masses are substantially balanced in order to isolate the scan table from vibration.

2. The actuating mechanism according to claim 1, wherein the second pivoting element includes an asymmetric leverage connection to the second coil and the scan table.

3. The actuating mechanism according to claim 2, further comprising: a first plate positioned on the second planar surface of the scanner chip, the first plate including first and second magnets that act upon respective ones of the first and second coils.

4. The actuating mechanism according to claim 1, wherein the scan table is about 6.8 mm square.

5. The actuating mechanism according to claim 1, wherein the first pivot element includes a center of mass that is substantially coincide with the first pivot point and the second pivot element has a center of mass that is substantially coincident with the second pivot point.

* * * * *